US008730453B2

(12) United States Patent
Sugiyama

(10) Patent No.: US 8,730,453 B2
(45) Date of Patent: May 20, 2014

(54) EXPOSURE APPARATUS

(75) Inventor: Shigehisa Sugiyama, Shizuoka (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/614,320

(22) Filed: Sep. 13, 2012

(65) Prior Publication Data

US 2013/0070228 A1 Mar. 21, 2013

(30) Foreign Application Priority Data

Sep. 16, 2011 (JP) ................................ 2011-202858

(51) Int. Cl.
*G03B 27/52* (2006.01)
*G03B 27/42* (2006.01)
*G03B 27/58* (2006.01)

(52) U.S. Cl.
USPC ................................ 355/55; 355/53; 355/72

(58) Field of Classification Search
CPC ................................ G03F 9/7073; G03F 7/20
USPC ............ 355/53, 67, 72, 75, 55; 356/399–401
See application file for complete search history.

(56) References Cited

U.S. PATENT DOCUMENTS

| | | | | |
|---|---|---|---|---|
| 5,182,615 A * | 1/1993 | Kurosawa et al. | ............ | 356/400 |
| 5,760,561 A * | 6/1998 | Chinju et al. | ................ | 318/593 |
| 6,525,804 B1 * | 2/2003 | Tanaka | ............................ | 355/53 |
| 7,728,953 B2 * | 6/2010 | Suzuki et al. | .................. | 355/55 |
| 2011/0075123 A1 * | 3/2011 | Nagamori | ...................... | 355/72 |
| 2011/0133354 A1 * | 6/2011 | Kimura | ....................... | 264/40.5 |

FOREIGN PATENT DOCUMENTS

| | | |
|---|---|---|
| JP | 09-115812 A | 5/1997 |
| JP | 2006-149051 A | 6/2006 |

* cited by examiner

*Primary Examiner* — Hung Henry Nguyen
(74) *Attorney, Agent, or Firm* — Rader, Fishman & Grauer PLLC

(57) ABSTRACT

An exposure apparatus includes a light emitting unit, a mask stage that holds a mask for forming a pattern on a workpiece and a moving stage that holds the workpiece and has a laser length measuring device. The apparatus further includes an XYθ direction moving mechanism that moves the moving stage within a plane parallel to the workpiece face, and a Z direction moving mechanism that moves the moving stage in a vertical direction. The laser length measuring device measures a distance between the device and a reflection mirror using laser light. A control unit controls the XYθ direction moving mechanism to move the moving stage based on the distance. The reflective mirror is fixed to a structural body that supports the mask stage.

6 Claims, 8 Drawing Sheets

EXPOSURE APPARATUS

CROSS-REFERENCES TO RELATED APPLICATION

This application claims priority from Japanese Patent Application Serial No. 2011-202858 filed Sep. 16, 2011, the contents of which are incorporated herein by reference in its entirety.

TECHNICAL FIELD

The present invention relates to an exposure apparatus, and more particularly relates to an exposure apparatus capable of making small the amount of position shift of a moving stage on a stage face, which is produced when the moving stage is moved perpendicularly to the stage face thereof.

BACKGROUND

An exposure apparatus is used, for example, for forming a wiring pattern etc. in a manufacturing process of a printed circuit board, a liquid crystal panel etc. (hereinafter referred to as a workpiece). FIG. 6 shows a configuration example of such an exposure apparatus. The exposure apparatus shown in FIG. 6 comprises a projection lens, and is a projection type exposure apparatus, in which a mask pattern is projected onto a workpiece by the projection lens to perform an exposure. In the projection type exposure apparatus shown in the figure, an alignment mark (hereinafter referred to as a work mark WAM) is formed on a back side face of the workpiece W, and the position of the alignment mark on the back side face of this workpiece and the position of an alignment mark formed on a mask M (hereinafter referred to as mask marks MAM) are aligned so that an exposure may be carried out. Such an exposure apparatus is disclosed in Japanese Patent No. 3201233. The exposure apparatus mainly comprises a light emitting unit 10, the mask M in which a pattern to be exposed (transferred) onto a workpiece is formed, a mask, stage 20, which holds the mask, a work stage 30 including an adsorption table 33, which holds the workpiece W to be exposed, such as a printed circuit board and a liquid crystal panel, and the projection lens 40, which projects the pattern, formed in the mask M, onto the workpiece W held on the adsorption table 33. In addition, there is also another type of exposure apparatus, which uses a mirror but does not use a lens as a projection means for projecting a pattern, which is formed in the mask M, onto the workpiece W, which is held on the work stage 30.

The light emission unit 10 includes a lamp 11, which is a light source for emitting exposure light, and a mirror 12, which reflects light emitted from the lamp 11, etc. Moreover, the work stage 30 comprises the adsorption table 33, which holds the workpiece W, a moving stage 32, which includes a XYθ drive unit 37, and a Z direction moving stage moving mechanism 50 including a Z drive unit 51, wherein the moving stage 32 is placed on the Z direction moving stage moving mechanism 50. Moreover, the adsorption table 33 holding the work W is attached to the moving stage 32. The moving stage 32 and the adsorption table 33 of the work stage 30 are moved by the XYθ drive unit 37 in XY directions (two axes, which are parallel to a workpiece face—a face that is irradiated with exposure light—and intersect with each other, that is, two axes, which intersect with the optical axis of a projection lens at right angles) and in a θ direction (rotation with respect to an axis that is perpendicular to the workpiece face, i.e., rotation with respect to the axis parallel to the optical axis L of the projection lens 40). In addition, the moving stage 32 and the adsorption table 33 of the work stage 30 are moved in a Z direction (a direction perpendicular to the workpiece face, that is, parallel to the optical axis L of the projection lens 40) by the Z drive unit 51 of the Z direction moving stage moving mechanism 50. The adsorption table 33 is also moved in the XYθ drive directions integrally with the moving stage 32.

A drive apparatus for the XYθ drive unit 37 is, for example, a radial type servo motor in which a detection unit (such as an encoder) for detecting the amount of movement thereof in the XYθ direction is built. The moving stage 32 is attached to the servo motor through a linear guide, ball screws, etc., wherein the moving stage 32 can be moved in the XYθ direction by driving the servo motor. Similarly, the Z drive unit 51 of the Z direction moving stage moving mechanism 50 may be configured by a linear guide, a ball screw, a radial type servo motor, in which a detection unit (for example, an encoder) for detecting the amount of movement thereof in the Z direction is built, and so on, wherein the moving stage 32 can be moved in the Z direction by driving this servo motor.

The light emitting unit 10, the mask stage 20, the projection lens 40, and the Z direction moving stage moving mechanism 50 are supported by and fixed to a single structural body (frame 60). That is, the mask stage 20 is held by the frame 60 through the frame 61 holding the mask stage, and the projection lens 40 is supported by the frame 60, which supports the entire apparatus, through the frame 62 for fixing the projection lens. Although, in the above description the drive apparatus comprises servo motors etc. as a unit for moving the work stage, a surface motor stage apparatus (for example, refer to Japanese Patent Application Publication No. 2006-149051 etc.), or a SOYA motor stage apparatus, etc. can also be used as a mechanism for moving the work stage. In addition, in FIG. 6, a control unit for controlling an operation of the exposure apparatus and a power supply unit for lighting a lamp, are omitted.

However, the above described exposure apparatus of the related art is unable to achieve a desired accuracy in the pattern formed in the workpiece, for the reasons described below.

In the exposure apparatus shown in FIG. 6, two or more workpiece marks WAM (two marks are shown in FIG. 6) are formed on a back side face of the workpiece W. Through holes 33*a* are formed at positions corresponding to the positions of the workpiece marks WAM of the work stage 30. And an alignment microscope 80 for detecting the workpiece marks WAM and the mask marks MAM formed on the mask M is attached to the work stage 30 through the through holes 33*a*. A focal point f2 of the alignment microscope 80 is set so as to be located at a top face position of the adsorption table 33, which is a position on a back side face of the workpiece W, so that the workpiece marks WAM on the back side face of workpiece W may be detected.

A procedure for exposing a workpiece comprising steps from a positioning step of the mask and workpiece to a light exposure step in the exposure apparatus of the related art will be described below.

(1) First, the mask mark MAM is detected. Exposure light is emitted from the light emitting unit 10 in a state where there is no workpiece W on the adsorption table 33. The mask mark MAM formed in the mask M is projected by the projection lens 40, and an image thereof is focused at a position corresponding to a top face of the workpiece W. A focal position f1 of the projection lens 40 (that is, a position at which an image of the mask mark MAM formed on the mask and a pattern image are focused) is adjusted in advance, so as to be located on a surface of the workpiece W when the workpiece W is placed on the adsorption table 33 of the moving stage 32.

(2) As described above, the focal position f2 of the alignment microscope 80 is located at the surface position of the adsorption table 33. Therefore, the focal position f1 of the projection lens 40 and the focal position f2 of the alignment microscope 80 do not coincide. If both do not coincide, the alignment microscope 80 cannot receive a focused and clear image of the mask mark MAM. Therefore, as shown in FIG. 7, the entire work stage 30 is raised by a distance that is equivalent to the thickness of the workpiece W by the Z direction moving stage moving mechanism 50. The focal position f1 of the projection lens 40 (an image forming position of the mask mark MAM) and the focal position f2 of the alignment microscope 80 are then in agreement with each other so that the alignment microscope 80 receives a focused image of the mask mark MAM.

(4) The alignment microscope 80 detects the projected image of the mask mark MAM, and stores the position thereof by a control unit (not shown). When the control unit stores the position of the mask mark MAM, emission of the exposure light from the light emission unit 10 is stopped. The workpiece W is conveyed by a conveyance mechanism (not shown), and is placed on the adsorption table 33 of the moving stage 32.

(5) The alignment microscope 80 next detects the workpiece marks WAM on the back side face of workpiece W through the through holes 33*a* of the adsorption table 33. The positions of the detected work marks WAM are compared with the positions of the saved mask marks MAM, and the control unit (not shown) moves the moving stage 32 within a plane perpendicular to the optical axis L, of the projection lens 40, in the X directions (horizontal directions on the drawing), the Y directions (front and back directions with respect to the drawing), and the θ direction (a rotation direction with respect to the optical axis), so that both mask marks MAM satisfy a predetermined positional relation (for example, the positions are match with each other).

(6) The alignment of the mask M and the workpiece W is completed by the above-described procedure, and then exposure treatment starts next. However, exposure cannot be performed in this state. This is because the focus position f1 of the projection lens 40 (an image forming position of the pattern formed on the mask M) is located at the surface position of the adsorption table 33 rather than a top face position of the workpiece W. Therefore, the work stage 30 is lowered by the thickness of the workpiece W by the Z direction moving stage moving mechanism 50 so that the focus position f1 of the projection lens 40 may be located at a surface position of the workpiece W.

(7) Exposure light is again emitted from the light emitting unit 10 in this state. An image of the pattern formed in the mask M is projected and focused on the surface of the workpiece W so that the workpiece W may be exposed. The exposed workpiece W is taken out from the adsorption table 33 by a conveyance mechanism (not shown).

As described in the procedure (6), in order to move the focus position f1 of the projection lens 40 to the front face of the workpiece W from the front face of the adsorption table 33 after positioning of the mask M with the workpiece W, the work stage 30 is moved in a direction of an optical axis L of the projection lens 40 (that is, it is lowered in the Z direction). Therefore, the straightness of the Z direction moving stage moving mechanism 50 affects the accuracy of exposure with respect to the workpiece W. As shown in FIG. 8, in the exposure apparatus shown in FIG. 6, if the straightness of the Z direction moving stage moving mechanism 50 is not good, when the work stage 30 (shown in dotted lines), which has been raised, is lowered, the moving stage 32, which holds the workpiece W, is moved within the XY plane in left-right and front-back side directions with respect to the figure (XY directions) and a rotation direction with respect to the optical axis (θ direction), so that the workpiece may shift from the position, which is aligned with the mask M.

For example, when the workpiece W is a printed circuit board, the thickness thereof is approximately 1 mm. Therefore, in the above-described procedure, the work stage 30 is moved by 1 mm in a direction of the optical axis L of the projection lens 40 (Z direction). In the case where it is moved in the Z direction by approximately 1 mm in a currently available apparatus, it turns out that a straightness deviation $d_{xy}$ of 0.2 to 0.3 μm is generated when in the XY direction, and a straightness deviation $d_\theta$ (a shift in the XYθ direction) of 5 μrad (micro radian) is generated in the θ direction. In the above-described current apparatus, it is desired to attain an exposure accuracy of 0.5 μm or less. However, if the above mentioned shift resulting from the movement in the Z direction of such a work stage occurs, it will become difficult to attain the exposure accuracy of 0.5 μm or less.

In a conventional apparatus, the moving stage 32 having the XYθ drive unit 37 is placed on the Z direction moving stage moving mechanism 50, and the encoder provided in the XYθ drive unit 37 detects the amount of movement of the moving stage 37 with respect to the Z direction moving stage moving mechanism 50. For this reason, as described above, when the moving stage 32 is moved in the direction of the optical axis L of the projection lens 40 (the Z direction) by the Z direction moving stage moving mechanism 50, even if the moving stage 32 (adsorption table 33) holding the workpiece W is moved (shifted) in the XYθ direction because of the straightness, it is impossible to detect how much this moving stage 32 is moved in the XYθ direction.

In view of the above, it is an object of the present invention to solve the above problem. That is, it is an object of the present invention to make it possible to detect the amount of shift within a plane parallel to a workpiece face, which results from the straightness of a moving mechanism for moving a work stage in a Z direction when a work stage is moved in a direction perpendicular to the workpiece face (the Z direction), thereby adjusting the position of the workpiece.

In the work stage of the prior art, the XYθ drive unit 37, which comprises the detection unit (hereinafter also referred to as a position detection unit) such as an encoder for detecting the amount of movement in the XYθ direction of the moving stage 32, is provided on the Z direction moving stage moving mechanism 50, which moves in the Z direction. Therefore, when the moving stage 32 is moved by the Z direction moving stage moving mechanism 50 in the direction perpendicular to the workpiece face (the Z direction), the moving stage 32 and the XYθ drive unit 37 having the position detection unit for detecting the amount of movement in the XYθ direction, integrally move with the Z direction moving stage moving mechanism 50.

Therefore, even if the moving stage 32 is moved within a plane parallel to the workpiece face when moving in the Z direction (even if it shifts in the XYθ direction), the position detection unit such as an encoder of the moving stage 32, which detects the amount of relative movement with respect to the Z direction moving stage moving mechanism, cannot detect the amount of movement in the XYθ direction of the workpiece, which is produced due to straightness of the Z direction moving stage moving mechanism 50 (the amount of shift from the optical axis). For this reason, in the work stage, in which the XYθ drive unit comprising the moving stage 32 and the position detection unit for detecting the amount of movement of the moving stage 32, is provided on the Z direction moving stage moving mechanism 50, even though the positional accuracy thereof in the XYθ direction is improved, unless the straightness thereof at time of movement in a Z direction is improved, there is a limit on improvement of the positional accuracy thereof in the XYθ direction. With regards to such a problem, when the moving stage is moved in the Z direction (a direction perpendicular to a workpiece face), if the amount of shift in the XYθ direction of the moving stage can be measured, the moving stage can be returned to the original position based on the amount of shift, so that it is possible to solve the above-mentioned problem.

SUMMARY

An exposure apparatus of the present invention contains: a moving stage that includes a laser length measuring device, the laser length measuring device is configured to emit and receive a laser light; an XYθ direction moving mechanism configured to move the moving stage within a plane; a Z direction moving mechanism configured to move the moving stage and the XYθ direction moving mechanism in a direction perpendicular to the plane; a reflective mirror that is configured to reflect the laser light, the laser length measuring device is configured to measure a distance between the laser length measuring device and the reflection mirror; and a control unit configured to control the XYθ direction moving mechanism to move the moving stage based on the distance.

The exposure apparatus of the present invention may include a light emitting unit that emits exposure light and a mask stage that holds the mask with a pattern formed. The reflective mirror may be fixed to a structural body that supports the mask stage.

The XYθ direction moving mechanism may further contain a planate platen on which projection terminals are formed in a grid pattern, and a moving element that has magnetic poles for generating a shifting magnetic field in an axial direction of each of X-Y coordinate axes which intersect perpendicularly to each other on a platen face.

Since the mirror, which reflects laser from the laser length measuring device provided on the moving stage of the work stage, is integrally fixed to the structural body, which supports the mask stage for holding a mask, when the work stage is moved in the Z direction (a direction perpendicular to the workpiece face), even if the moving stage is moved in the XY direction (direction parallel to the workpiece face), and in the θ direction (a rotation direction with respect to an axis perpendicular to the workpiece face), the reflective mirror does not shift. Therefore, when the work stage is moved in the Z direction, even if a slider is moved in the XY direction or the e direction, it is possible to detect the amount of movement thereof by the laser length measuring device. For this reason, the moving stage is moved so that the detected amount of movement may be canceled, whereby the workpiece can be returned to the original position (a position where the position of the mask and that of the workpiece are aligned).

BRIEF DESCRIPTION OF THE DRAWING

Other features and advantages of the present exposure apparatus will be apparent from the ensuing description, taken in conjunction with the accompanying drawings, in which.

DESCRIPTION

In the present invention, a laser length measuring unit, which is made up of a laser length measuring device for emitting and receiving laser and a reflective mirror, is used as the position detection unit, and the laser length measuring device is provided on the moving stage, and further the reflective mirror is integrally fixed to a frame, which supports a mask stage for holding a mask, a projection lens, etc., rather than a Z direction moving stage moving mechanism which moves in the Z direction. In such a configuration, when the moving stage is moved in the Z direction by the Z direction moving stage moving mechanism, even if the workpiece shifts in the XYθ direction due to the straightness of the Z direction moving stage moving mechanism, it is possible to make correction by obtaining the amount of shift in the XYθ direction of the workpiece by the position detection unit. That is, the position of the moving stage in the XYθ direction before moving it in the Z direction by the laser length measuring unit is obtained and stored in a memory unit provided in a control unit, and the position in the XYθ direction after moving the moving stage in the Z direction is measured by the laser length measuring unit. In the control unit, the stored position thereof in the XYθ direction is compared with the position thereof in the XYθ direction after moving it in the Z direction, thereby obtaining the amount of positional shift in the XYθ direction due to the movement in the Z direction. If the moving stage is moved in the XYθ direction so that the amount of shift may be canceled, the shift in the XYθ direction of the workpiece caused by the straightness of the Z direction moving stage moving mechanism can be corrected.

Figure 1:
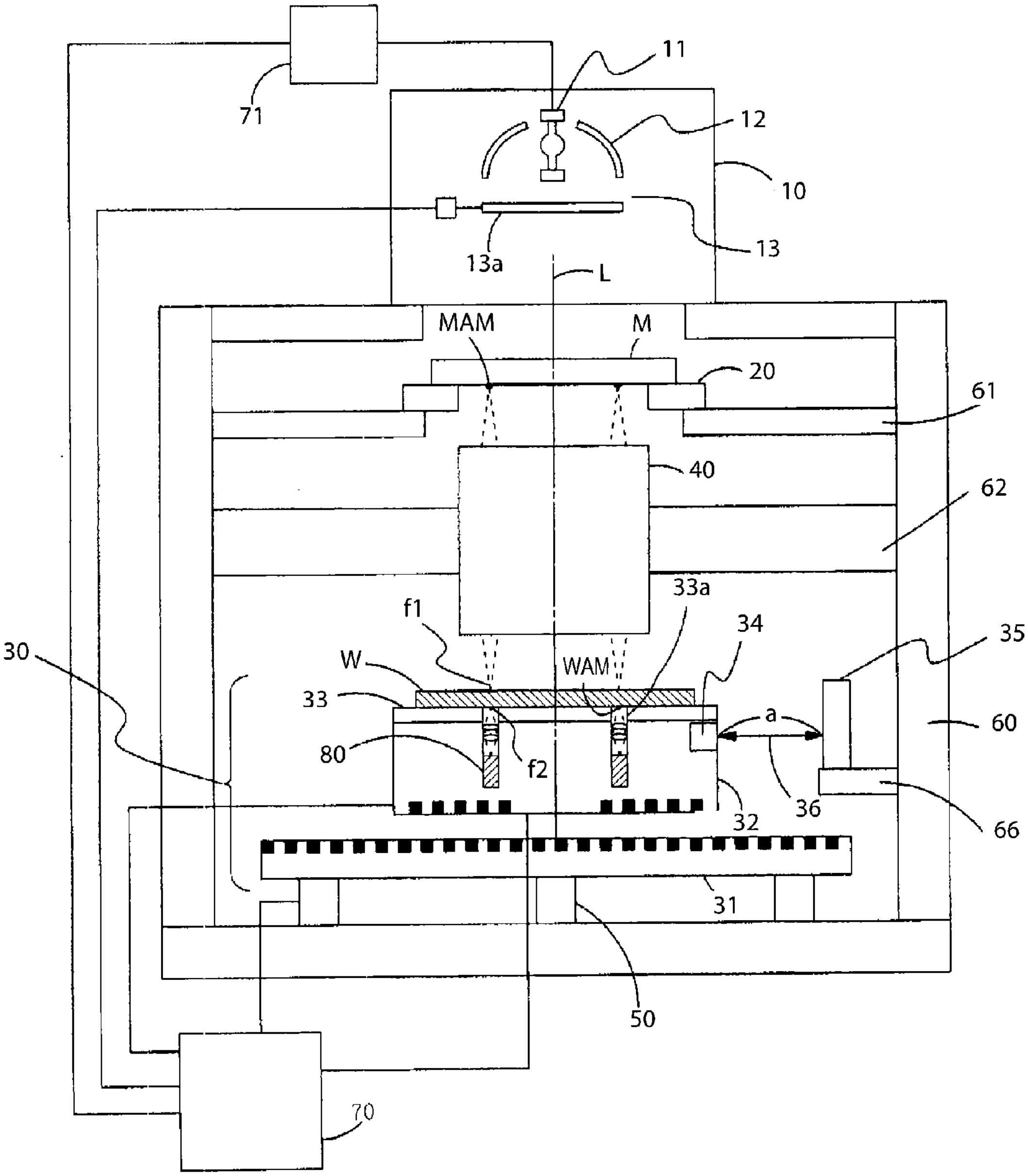
FIG. 1 is a diagram showing a configuration example of an exposure apparatus according to an embodiment of the present invention.
Figure 6:
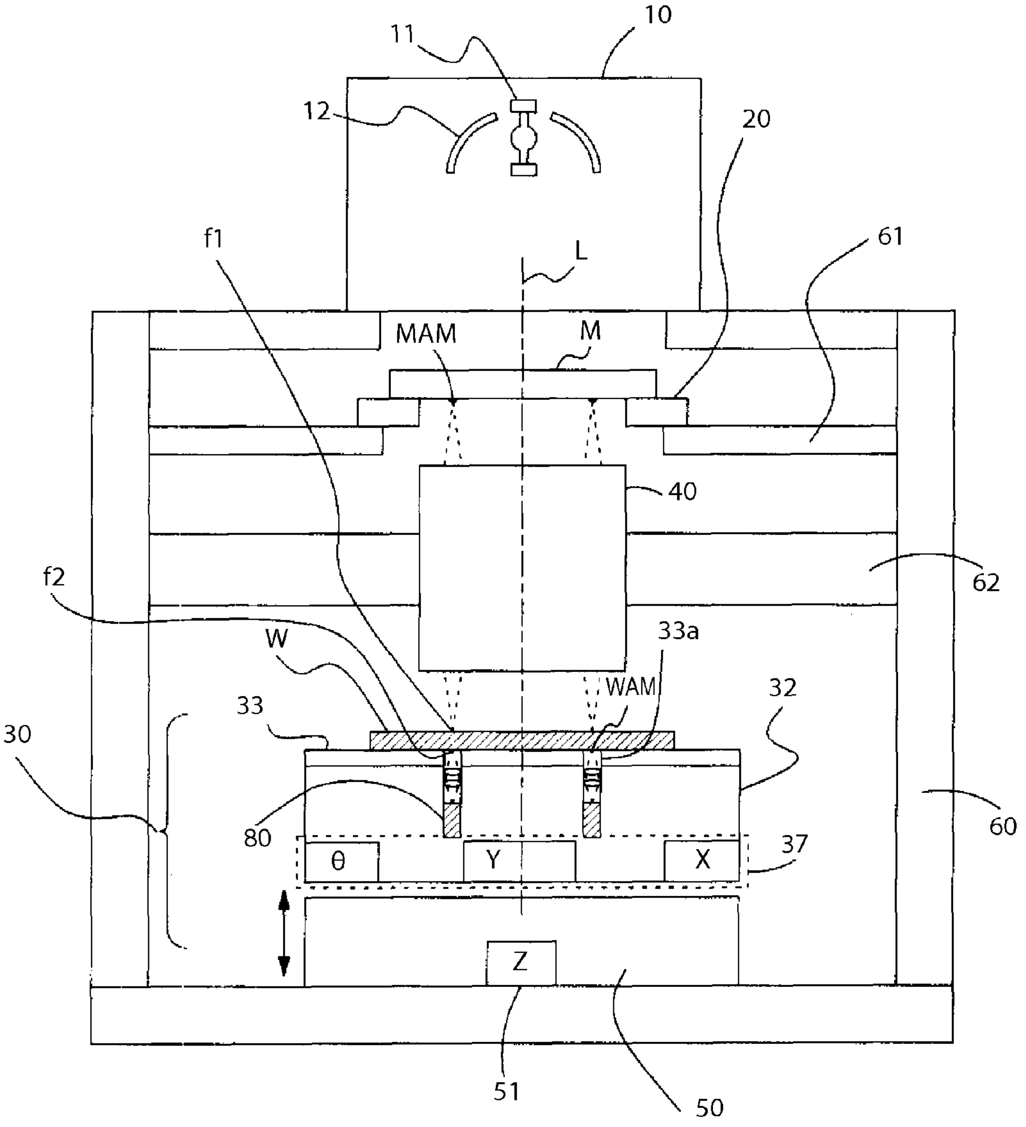
FIG. 6 is a diagram showing an example of an exposure apparatus of a related art.
Figure 7:
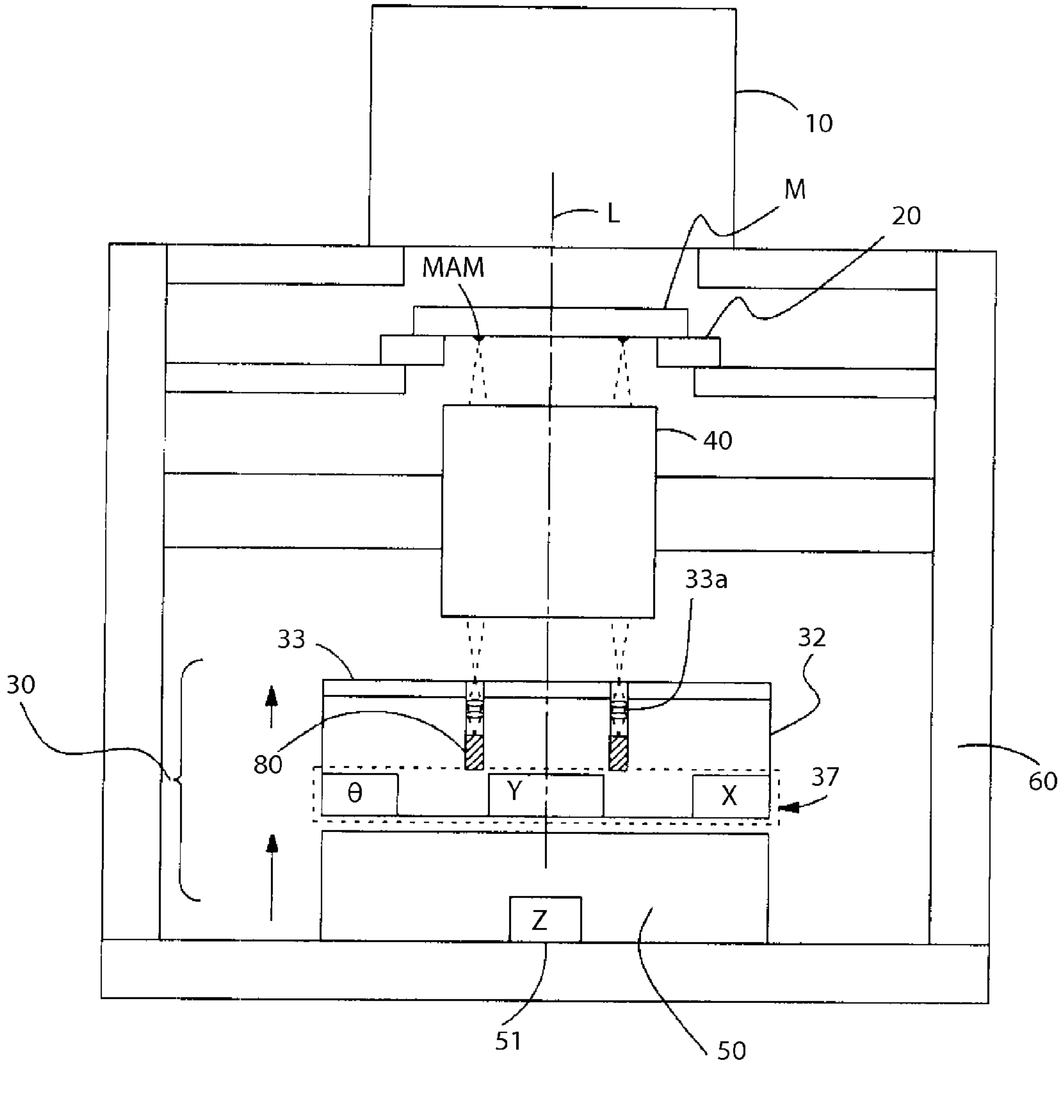
FIG. 7 is a diagram showing a state where the work stage shown in FIG. 6 is raised.
Figure 8:
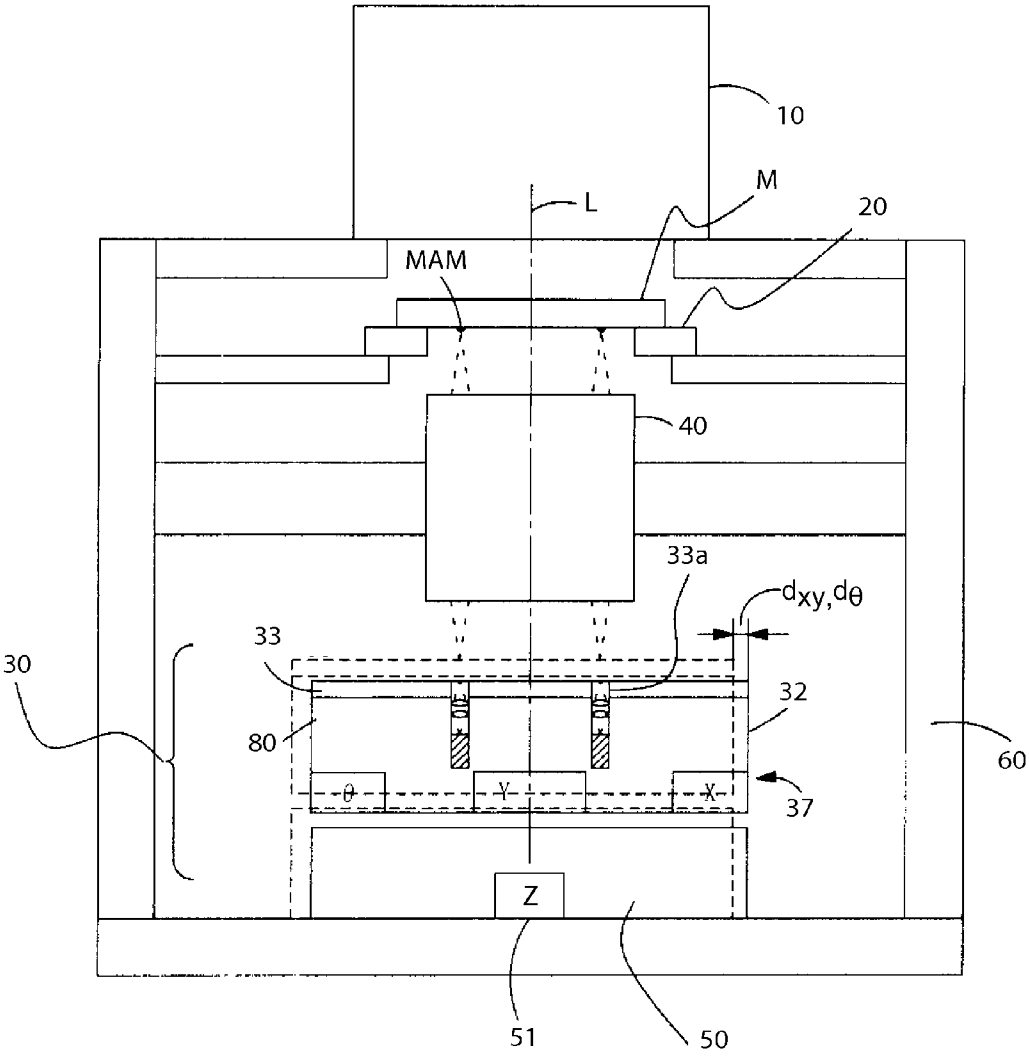
FIG. 8 is a diagram for explaining movement of a moving stage in a XYθ direction due to the straightness of a Z direction moving stage moving mechanism shown in FIG. 6.

A configuration example of an exposure apparatus according to an embodiment of the present invention is shown in FIG. 1. The figure shows a projection exposure apparatus which exposes a workpiece Won which alignment marks WAM are formed on a back side face of a workpiece W, as in the case of the prior art. The exposure apparatus in this embodiment is similar to that shown in FIG. 6, and mainly comprises a light emission unit 10, a mask M, on which a pattern to be exposed (transferred) onto the workpiece W is formed, a mask stage 20 holding this mask M, a work stage 30 holding the workpiece W such as a printed circuit board, a liquid crystal panel etc., on which exposure processing is performed, and a projection unit, which projects the pattern, formed on the mask M, on the workpiece W placed on the work stage 30. In addition, although there are various types of projection units, including one using a projection lens and one using a mirror without using a lens, etc., in this embodiment a projection lens 40 is described as an example thereof. In the present invention, the type of projection unit does not matter. The light emitting unit 10 comprises a lamp 11, which is a light source and emits exposure light, a mirror 12, which reflects light emitted from the lamp 11, and a shutter mechanism 13, which has a shutter 13*a* and which controls emission of the exposure light by controlling opening and closing of the shutter 13*a*.

The work stage 30 according to this embodiment is a plane stage using a surface motor (SOYA motor) similar to that disclosed in the above-mentioned Japanese Patent Application Publication No. 2006-149051, and the work stage 30 includes a platen 31 and a moving stage 32 (hereinafter referred to as a slider). The platen 31 is a component having a plane, on which a projection terminal made from a magnetic body and in shape of a grid pattern is formed. The slider 32 is raised by an action of air above this platen 31. When a magnetic force is applied to the slider 32 in this state, and the magnetic field between the slider 32 and the projection terminal of the platen 31 is changed, the slider 32 is moved above the platen 31 and within the XY plane which intersects perpendicularly with the optical axis L of the projection lens 40. The magnetism for applying the magnetic force to the platen 31 and the slider 32 is the XYθ direction moving stage moving mechanism (slider).

The laser length measuring device 34 for measuring the position of the slider 32 is attached to the slider 32. And the reflective mirror 35, which reflects the laser light 36 from this laser length measuring device 34, is fixed to a frame 60 to which the mask stage 20 and the projection lens 40 are fixed. The laser light 36 emitted from the laser length measuring device 34 is reflected by the reflective mirror 35, and then returns to the laser length measuring device 34, so that the position a of the slider 32 (moving distance) is measured. In addition, although only the laser length measuring device that measures the distance in the X direction (horizontal directions in the drawing) is shown in FIG. 1, a laser length measuring device that measures a distance in the Y direction (front and back side directions in the drawing) and a reflective mirror (not shown) are also provided, whereby the amount of movement in the XYθ direction can be measured by the laser length measuring device etc. An adsorption table 33 to which a vacuum pipe (not shown) for adsorbing and holding the workpiece W is connected, is attached to the slider 32, so that the workpiece W on which exposure processing is performed, may be adsorbed and held. The position of the slider 32 is detected by the laser length measuring device 34, and the workpiece W adsorbed on the adsorption table 33 and the mask M are positioned with each other so as to be exposed.

A Z direction moving stage moving mechanism 50 (hereinafter also referred to as a Z direction moving mechanism 50) moves the work stage 30 in a direction of the optical axis L of the projection lens 40 (vertical directions in the drawing, a Z direction). The Z direction moving mechanism 50 may comprise a radial type servo motor, in which a detection unit (for example, an encoder) for detecting the amount of movement in the Z direction is built as described above, a linear guide, a ball screw etc. A control unit 70 of the exposure apparatus is configured to control, an operation of a lamp lighting apparatus 71, which supplies electric power to the lamp 11 of the light emitting unit 10 so as to light the lamp, an operation of the shutter mechanism 13, an operation of a zoom mechanism of the projection lens 40, an operation of the slider 32 of the work stage 30 (an operation of an XYθ direction moving stage moving mechanism), an operation of the Z direction moving mechanism 50, etc. The light emitting unit 10, the mask stage 20, the projection lens 40, the Z direction moving mechanism 50, and the reflective mirror 35 are supported and fixed to a single structural body (frame 60). That is, the mask stage 20 is held by the frame 60 which supports the entire apparatus, through a frame 61 holding the mask stage 20. The projection lens 40 is supported by the frame 60 through a frame 62, which fixes the projection lens 40. The reflective mirror 35 is supported by the frame 60 through the frame 63, which supports the reflective mirror 35. The platen 31, the slider 32, etc. are supported by the frame 60 through the Z direction moving mechanism 50.

In addition, the reflective mirror 35 is required to have a length as long as a stroke (a traveling distance) of the slider 32, so that the weight thereof becomes comparatively large. Therefore, if the reflective mirror 35 is provided on the slider 32, the slider 32 will become much heavier, so that a quick movement or quick positioning becomes difficult. Moreover, a large-sized drive mechanism etc. is needed therefor. On the other hand, in recent years, a semiconductor laser device has been used as a light source for a laser length measuring device, so that such a laser length measuring device becomes lightweight as compared with conventional ones. For this reason, even if such a laser length measuring device is provided on the movable body side (slider 32), an increases in weight is small. So, in this embodiment, the laser length measuring device 34 is provided on the slider 32, and the reflective mirror 35 is attached to the frame 60.

Description of a procedure for exposing a workpiece comprising steps from a positioning step of the mask and the mark to an exposure step in the projection exposure apparatus according to the present invention will be given below, referring to FIGS. 1-4. Two or more workpiece marks WAM (two marks are shown in FIG. 1) are formed on a back side face of the workpiece W, as in the background art. Through holes 33*a* are formed in the adsorption table 33 at a positions corresponding the positions of the workpiece marks WAM. The alignment microscope 80 for detecting the workpiece marks WAM and mask marks MAM through the through holes 33*a* is attached to the slider 32. In order to detect the workpiece marks WAM on the back side face of the workpiece W, a focal point f2 of the alignment microscope 80 is set so as to be located at a surface position of the adsorption table 33, which is a back side position of the workpiece W. Moreover, the focal position f1 of the projection lens 40 is set so as to be located at a top face position of the workpiece W when the workpiece W is placed on the adsorption table 33 of the slider 32 (that is, it is adjusted in advance so that a position of the mask marks MAM or a pattern of the masks are focused).

As described above, the projection exposure apparatus according to this embodiment performs alignment of the mask M and the workpiece W by using the workpiece W upon which the workpiece marks WAM are provided (on a back side face). Specifically, without setting the workpiece W thereon, adjustment is made so that an image of the mask marks MAM may enter a view of the alignment microscope 80, and the image forming position f1 of the mask marks MAM and the focal position f2 of the alignment microscope 80 coincide, whereby a projection image of the mask marks MAM located at the image forming position f1 is received and image processing therefor is performed, so that the position of the mask mark MAM is detected and saved. Next, a workpiece W is set; the workpiece W is moved perpendicularly with respect to the exposure face, so that the workpiece mark WAM and the focal position f2 of the alignment microscope 80 coincide, thereby detecting the position of the workpiece mark WAM; the workpiece W is moved so that the mask mark MAM and the workpiece mark WAM may overlap with each other; the exposure face of the workpiece W, the mask pattern, and the image forming position f1 of the mask mark are made to coincide; and the mask pattern is projected on the workpiece through the projection lens thereby performing exposure.

Figure 2:
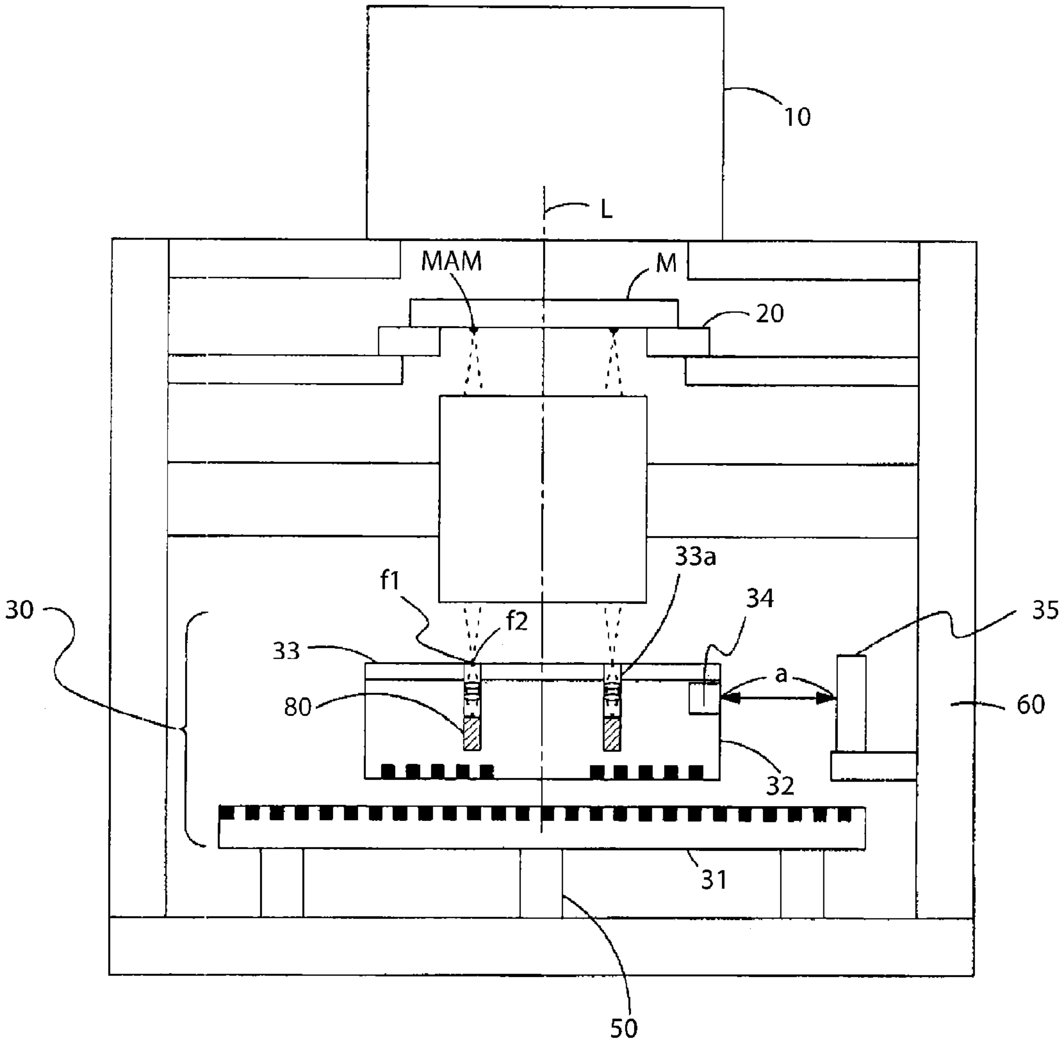
FIG. 2 is a diagram showing a state where a work stage shown in FIG. 1 is raised.

A more detailed description of the procedure for exposing the workpiece will be given below. First, the mask marks MAM are detected. In a state where there is no workpiece W on the adsorption table 33, the control unit 70 opens the shutter 13*a*, and has the light emitting unit 10 emit exposure light. The mask marks MAM are projected by the projection lens 40, and an image thereof is formed at the focal position f1 (a position equivalent to a top face of the workpiece W). As shown in FIG. 2, the Z direction moving mechanism 50 raises the work stage 30 (moved up in a direction of the optical axis L of the projection lens 40, that is, in a direction perpendicular to the workpiece face) by a distance corresponding to the thickness of the workpiece W. Thereby, the focal position f1 of the projection lens 40 (image forming position of the mask mark MAM) and the focal position f2 of the alignment microscope 80 are in agreement with each other. Thereby, the alignment microscope receives an image formed mask mark MAM image. In addition, with respect to the thickness of the workpiece W, the thickness of the workpiece W may be registered and saved in the control unit 70 in advance. A length measuring sensor is attached to a barrel of the projection lens 40, and a distance from the projection lens 40 to the surface of the adsorption table 33 and a distance from the projection lens 40 to the workpiece W is measured, whereby the thickness of the workpiece W is calculated based on a difference thereof.

The alignment microscope 80 detects the mask mark MAM image, and the position thereof is stored by the control unit 70. When the control unit 70 stores the position of the mask mark MAM, the control unit 70 closes the shutter 13*a*, and stops emission of the exposure light from the light emission unit 10. The workpiece W is conveyed by a conveyance mechanism (not shown), and is placed on the adsorption table 33 of the slider 32. The alignment microscope 80 detects the workpiece mark WAM formed on a back side face of the workpiece W. The position of the detected workpiece mark WAM is compared with the stored position of the mask mark MAM, and the control unit 70 moves the slider 32 in the X direction (horizontal directions in the drawing), the Y direction (front and back side directions in the drawing) and/or the θ direction (rotation direction with respect to the optical axis L), within a plane which intersects perpendicularly to the optical axis L of the projection lens 40, so that the workpiece mark WAM and the mask mark MAM satisfy the predetermined position relation (for example, both are in agreement with each other in position), whereby alignment of the mask M and the workpiece W is performed. At this time, the control unit 70 of the exposure apparatus stores the distance “a” from the slider 32 to the reflective mirror 35 (position information on the slider 32 which is raised) after the end of positioning.

Figure 3:
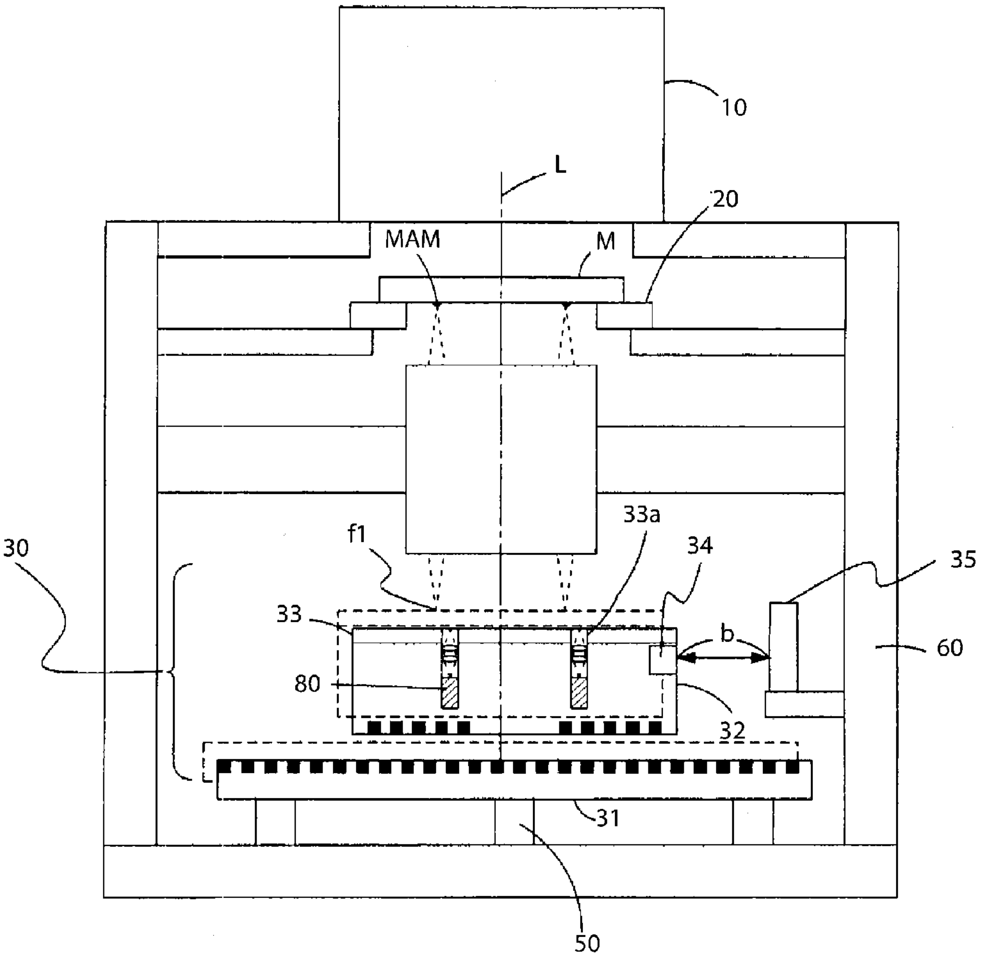
FIG. 3 is a diagram for explaining a state where a slider is moved in the XYθ direction due to the straightness of the Z direction moving stage moving mechanism shown in FIG. 1.

Next, in order to perform exposure processing, the Z direction moving mechanism 50 lowers the work stage 30 by the thickness of the workpiece W, so that the focal position f1 (image forming position of the mask pattern) of the projection lens 40 coincides with a surface position of the workpiece W. As shown in FIG. 3, in the case where the straightness of the Z direction moving mechanism 50 is poor, when the work stage 30 (shown in dotted lines in the figure) which has been raised, is lowered, the slider 32 holding the workpiece W may shift within the XY plane (the plane that intersects perpendicularly to the optical axis L of the projection lens 40) in the XY directions (left and right hand directions and front and back side directions in the drawing) and/or the θ direction (rotation direction with respect to the optical axis L). However, in the present invention, the reflective mirror 35, which reflects laser light 36 emitted from the laser length measuring device 34, is integrally fixed to the frame 60 to which the mask stage 20 holding the mask M is attached, it does not move with respect to the mask M. And since the reflective mirror 35 is integrally fixed to the frame 60, by measuring the distance “b” from the slider 32 to the reflective mirror 35 at time the work stage 30 is lowered, and by comparing the distance “b” with the distance “a” (refer to FIG. 1) at which the position of the stored mask M and that of the workpiece W are matched to each other (a distance from the slider 32 to the reflective mirror 35 at time the work stage 30 is raised), the amount of movement (the amount of shift) on how much the slider 32 (that is, the workpiece W which is fixed thereto) moved (shifted) in a direction perpendicular to the optical axis L of the projection lens 40 when the work stage 30 is lowered, can detected.

Figure 4:
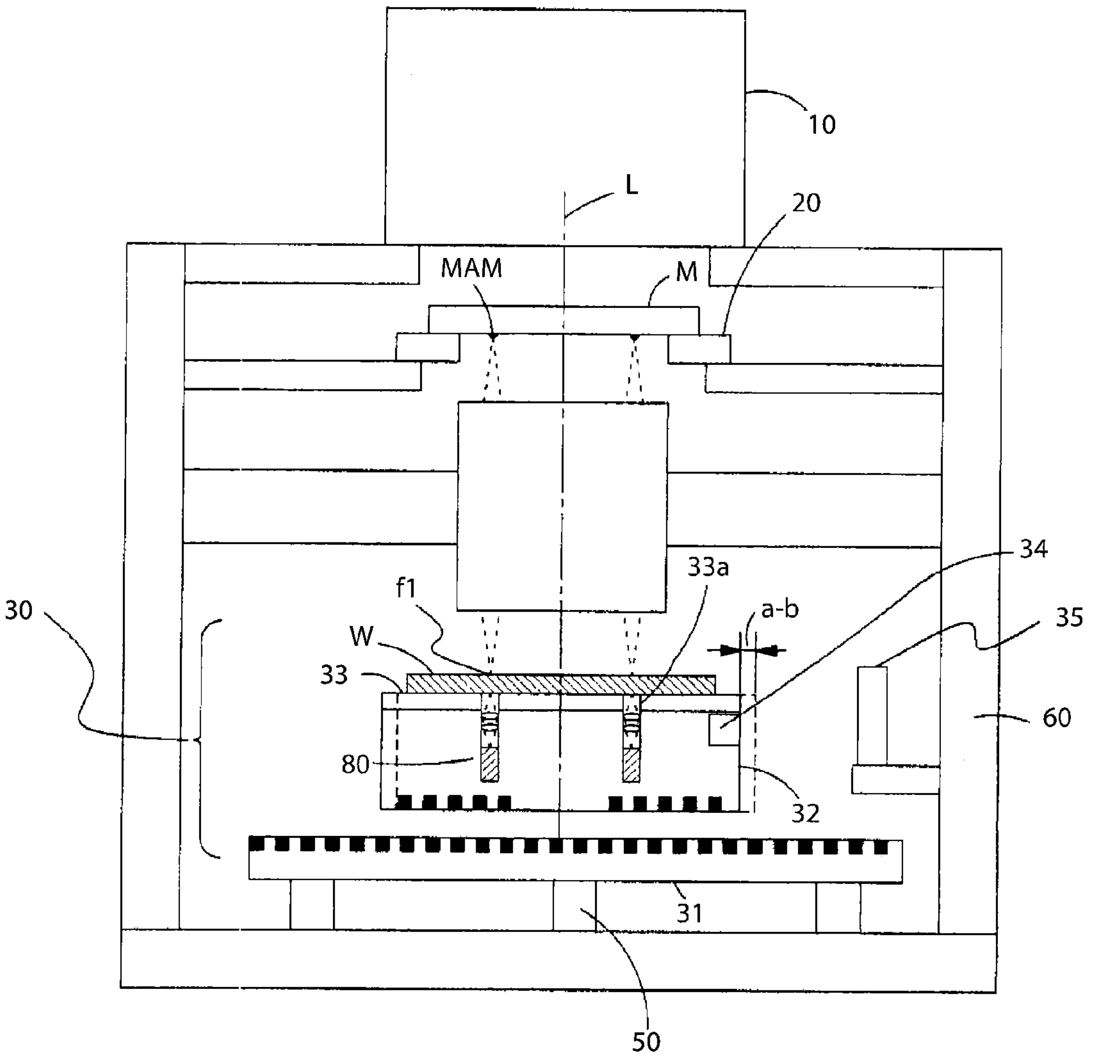
FIG. 4 is a diagram for explaining correction of movement of a slider due to the straightness of the Z direction moving stage moving mechanism shown in FIG. 1.

The control unit 70 of the exposure apparatus detects the distance “b” from the slider 32 to the reflective mirror 35 (the position information on the slider 32 which has been lowered) when the work stage 30 is lowered. And as shown in FIG. 4, the difference between the distance “a” and the distance “b” is obtained, and the slider 32 is moved by only that difference so that it may be returned to the position where the workpiece W and the mask M are aligned. In this state, the control unit 70 opens the shutter 13*a* again, and has the light emission unit 10 emit exposure light. The pattern formed in the mask M is projected on the surface of the workpiece W and an image thereof is formed thereon, so that the exposure is performed at a desired position (a position where the mask M and the workpiece W are positioned). The exposed workpiece W is taken out by the conveyance mechanism (not shown) from the adsorption table 33.

Figure 5A:
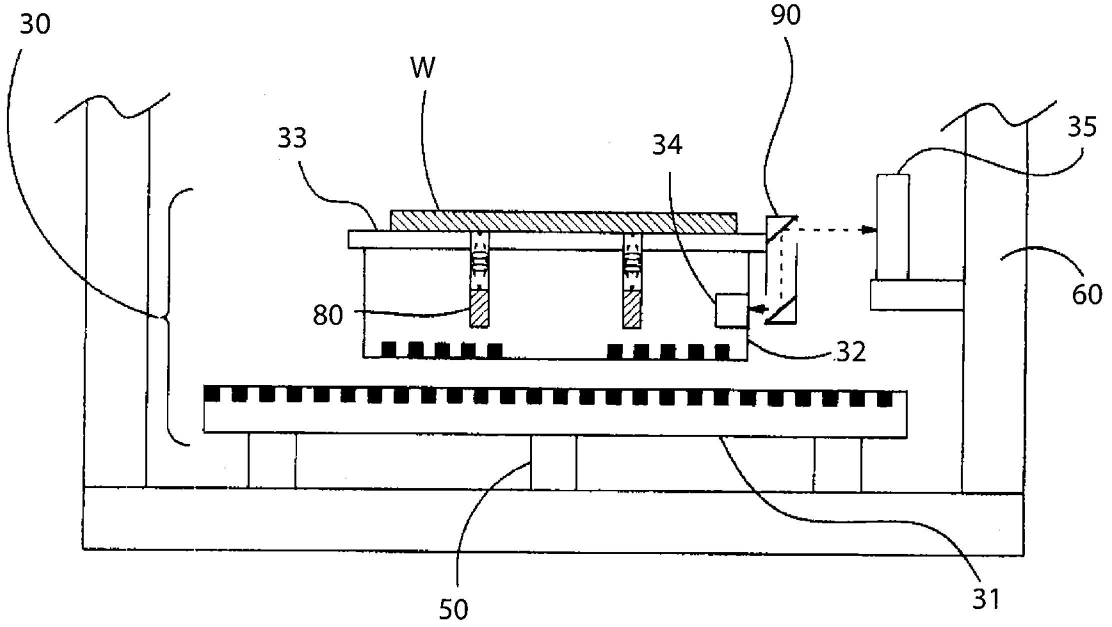
FIGS. 5A and 5B are diagrams showing a structural example of a work stage configured so that the height of laser light and the height of work stage may be matched.
Figure 5B:
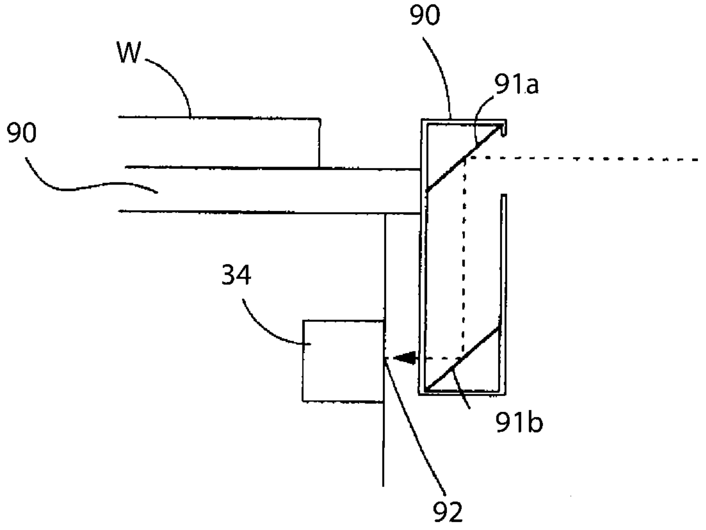

Here, in FIG. 1, which shows the above-mentioned embodiment etc., the height of the laser length measuring device 34 provided in the slider 32 is different from that of the workpiece W (a position in the direction of the optical axis L). However, as described below, it is possible to configure the structure so that the potion in a height direction of the laser light emitted from the laser length measuring device 34 may be matched with the position in a height direction of the workpiece W. FIGS. 5A and 5B are diagrams showing a structural example of a work stage configured so that the position in the height direction of laser light and the position in the height direction of the work stage may be matched with each other. In this embodiment, a laser light reflection unit 90 is attached to a side face of the adsorption table 33. As shown in FIG. 5B, the laser light reflection unit 90 has a structure such as that of a periscope, which is formed by combining total reflection mirrors 91*a* and 91*b* with each other, wherein the optical axis of laser light, which enters and is emitted from a laser receiving and emitting mouth 92, is moved to the position of a surface of the adsorption table 33. Moreover, the reflective mirror 35, which is provided at a reference position located outside the work stage in order to reflect laser light, is provided so as to face the adsorption table 33 corresponding to the position in the height direction of a top face of the adsorption table 33 and a moving direction thereof.

The laser light emitted from the laser length measuring device 34 is reflected by the total reflection mirror 91*a* and the total reflection mirror 91*b*, and the optical axis of the laser light is shifted by only a height (distance) corresponding to an interval between the total reflection mirrors 91*a* and 91*b*, so that the light may enter the reflective mirror 35 provided at a position where the reflective mirror 35 faces the total reflection mirror 91*a*. And the laser light reflected by the reflective mirror 35 is reflected by the total reflection mirror 91*a* and the total reflection mirror 91*b*, and enters the laser length measuring device 34. Although the light path length of the laser light becomes long because of the laser light reflection unit 90, since only the position in the height direction at which the laser light is emitted from the work stage 30 changes, it is possible to measure a distance as in the case of the first embodiment. In such a structure, a distance from the reflective mirror 35 at a workpiece W surface position can be correctly obtained.

In addition, in this embodiment, a surface motor stage apparatus, which is made up of a slider and a platen, is explained as an example of a work stage. However, the present invention can be also applied to a stage having a different structure. That is, regardless of the mechanism for moving a stage holding a workpiece in the XY directions which intersects perpendicularly to an optical axis, even if a linear motion guide is combined therewith, the present invention can be applied, so long as the stage has (1) the laser length measuring device, (2) a Z direction moving mechanism that moves the stage in the Z direction, and (3) a structure in which the stage is moved in the Z direction together with the mechanism for moving the stage in the XY directions. Moreover, in this embodiment, a work stage that is placed on the Z direction moving mechanism and is moved in the θ direction (a rotation direction with respect to the optical axis) has been explained. However, the present invention can be applied even if there is no mechanism that moves it in the θ direction on the work stage. Furthermore, although in the embodiment, the projection exposure apparatus having a projection lens is explained, the present invention is not limited to such a projection exposure apparatus. For example, the present invention can be applied to a proximity exposure apparatus etc. which does not have a projection lens.

The preceding description has been presented only to illustrate and describe exemplary embodiments of the present exposure apparatus. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. An exposure apparatus comprising:

a light emitting unit that emits exposure light;

a mask stage that holds a mask, the mask includes a pattern and a mask alignment mark; the exposure light is configured to form a pattern image and a mask alignment mark image at an image forming position;

a moving stage that is configured to hold a workpiece and includes a laser length measuring device and an alignment microscope, the laser length measuring device is configured to emit and receive a laser light, the pattern image and the mask alignment mark image are configured to be exposed onto a front face of the workpiece at the image forming position, a back face of the workpiece includes a workpiece alignment mark, the mask alignment mark and the workpiece alignment mark are configured to be aligned before the pattern is exposed onto the front face;

an XYθ direction moving mechanism configured to move the moving stage within a plane parallel to the front face;

a Z direction moving mechanism configured to move the moving stage in a direction perpendicular to the front face, together with the XYθ direction moving mechanism;

a reflective mirror that is configured to reflect the laser light, the laser length measuring device is configured to measure a distance between the laser length measuring device and the reflective mirror; and a control unit configured to control the XYθ direction moving mechanism to move the moving stage based on the distance;

wherein the reflective mirror is fixed to a structural body that supports the mask stage, wherein the control unit is configured to control the moving stage so that the mask alignment mark image at the image forming position enters a view of the alignment microscope, and the mask alignment mark image coincides a focal position of the assignment microscope;

the control unit is configured to detect the workpiece alignment mark when the workpiece is set on the moving stage and to move the moving stage so that the workpiece alignment mark coincides the mask alignment mark image at the image forming position; and the control unit is configured to control the Z direction moving mechanism so that the pattern image is formed on the front face at the image forming position.

2. The exposure apparatus according to claim 1, wherein the XYθ direction moving mechanism comprises:

a platen on which projection terminals are formed in a grid pattern, and a moving element comprising a magnetic pole that generates a shifting magnetic field in an axial direction of each of X-Y coordinate axes which intersect perpendicularly to each other on a face of the platen.

3. The exposure apparatus according to claim 1, wherein the XYθ direction moving mechanism is movable to X and Y directions.

4. The exposure apparatus according to claim 2, wherein the XYθ direction moving mechanism is movable to X, Y and θ directions.

5. An exposure apparatus comprising:

a mask stage configured to hold a mask, the mask includes a pattern and a mask alignment mark;

a moving stage that comprises an alignment microscope and is configured to hold a workpiece, a pattern image and a mask alignment mark image of the pattern and the mask alignment mark are configured to be exposed onto a front face of the workpiece at an image forming position, the workpiece comprises a workpiece alignment mark at a back face of the workpiece;

a control unit configured to move the moving stage, the control unit configured to control the moving stage so that the mask alignment mark image and a focal position of the alignment microscope coincide at the image forming position, the control unit configured to detect the workpiece alignment mark at the focal position and to move the moving stage so that the workpiece alignment mark coincides the mask alignment mark image at the image forming position, the control unit configured to move the moving stage to a Z direction that is perpendicular to the front face so that the pattern image is exposed onto the front face;

an XYθ direction moving mechanism configured to move the moving stage within a plane parallel to the front face;

a Z direction moving mechanism configured to move the moving stage and the XYθ direction moving mechanism in a direction perpendicular to the front face;

a structural body that supports the mask stage, the XYθ direction moving mechanism and the Z direction moving mechanism; and a reflective mirror that is fixed to the structural body;

wherein the moving stage comprises a laser length measuring device, the laser length measuring device is configured to emit and receive a laser light to and from the refractive mirror and to measure a distance between the laser length measuring device and the reflective mirror; and wherein the control unit is configured to control the XYθ direction moving mechanism and the Z direction moving mechanism to move the moving stage and the control unit is configured to control the XYθ direction moving mechanism to move the moving stage based on the distance.

6. An exposure apparatus according to claim 5, wherein:

the control unit is configured to control the XYθ direction moving mechanism and the Z direction moving mechanism to move the moving stage to the Z direction.

* * * * *